United States Patent
Schulz-Harder et al.

[11] Patent Number: 5,981,036
[45] Date of Patent: Nov. 9, 1999

[54] METAL CERAMIC SUBSTRATE

[76] Inventors: Jürgen Schulz-Harder, Hugo-Dietz-Strasse 32, D-91207 Lauf; Peter H. Maier, Hugo-Dietz Strasse 19, D-91207 Lauf, both of Germany

[21] Appl. No.: 08/835,049

[22] Filed: Mar. 27, 1997

[30] Foreign Application Priority Data

Apr. 3, 1996 [DE] Germany .............. 196 13 348
Apr. 19, 1996 [DE] Germany .............. 196 15 481

[51] Int. Cl.$^6$ ............................ B32B 3/00
[52] U.S. Cl. .................. 428/195; 428/209; 428/457; 428/688; 428/698; 428/702; 428/901
[58] Field of Search .................. 428/195, 209, 428/457, 627, 650, 674, 688, 698, 702, 901

[56] References Cited

U.S. PATENT DOCUMENTS 5,379,942  1/1995  Kuhnert et al. .................. 228/106

FOREIGN PATENT DOCUMENTS 0254692  1/1988  European Pat. Off. .
0279601  8/1988  European Pat. Off. .
2947270  12/1986  Germany .
4004844  1/1991  Germany .

*Primary Examiner*—Elizabeth Evans
*Attorney, Agent, or Firm*—Hoffman, Wasson & Gitler

[57] ABSTRACT

An arched metal-ceramic substrate with one ceramic layer and with a metal coating provided on the top and bottom of the ceramic layer which is curved around at least one axis parallel to the plane of the substrate such that it forms a convexly curved surface on the bottom. The thickness of the metal coatings on the top and bottom of the arched ceramic layer is the same.

32 Claims, 3 Drawing Sheets

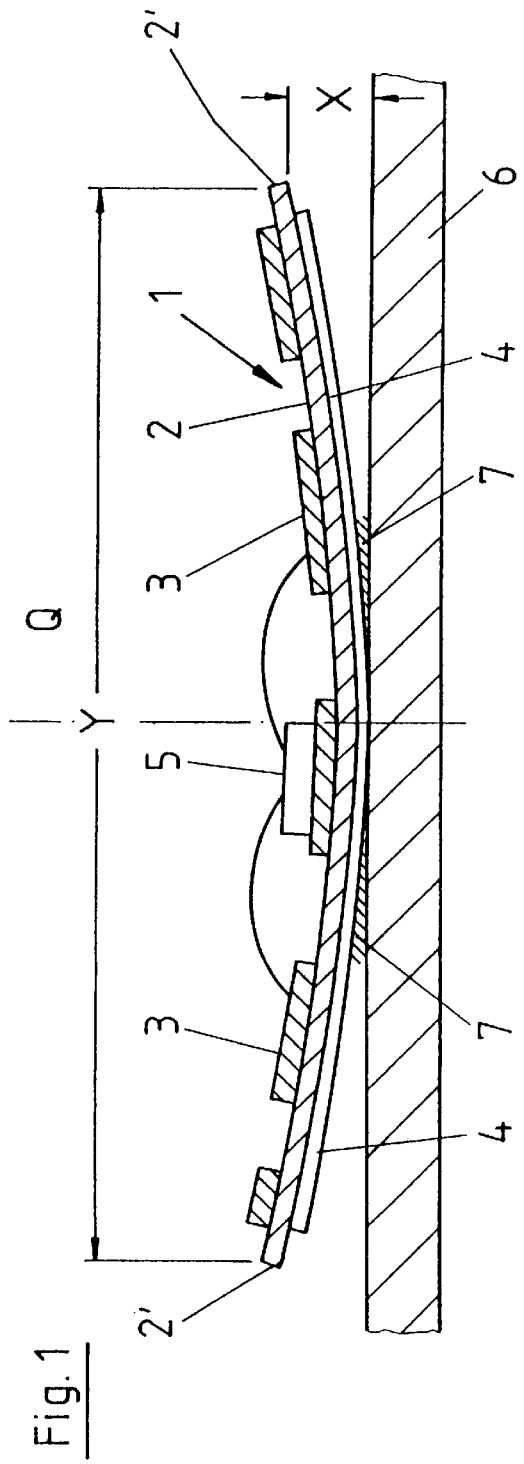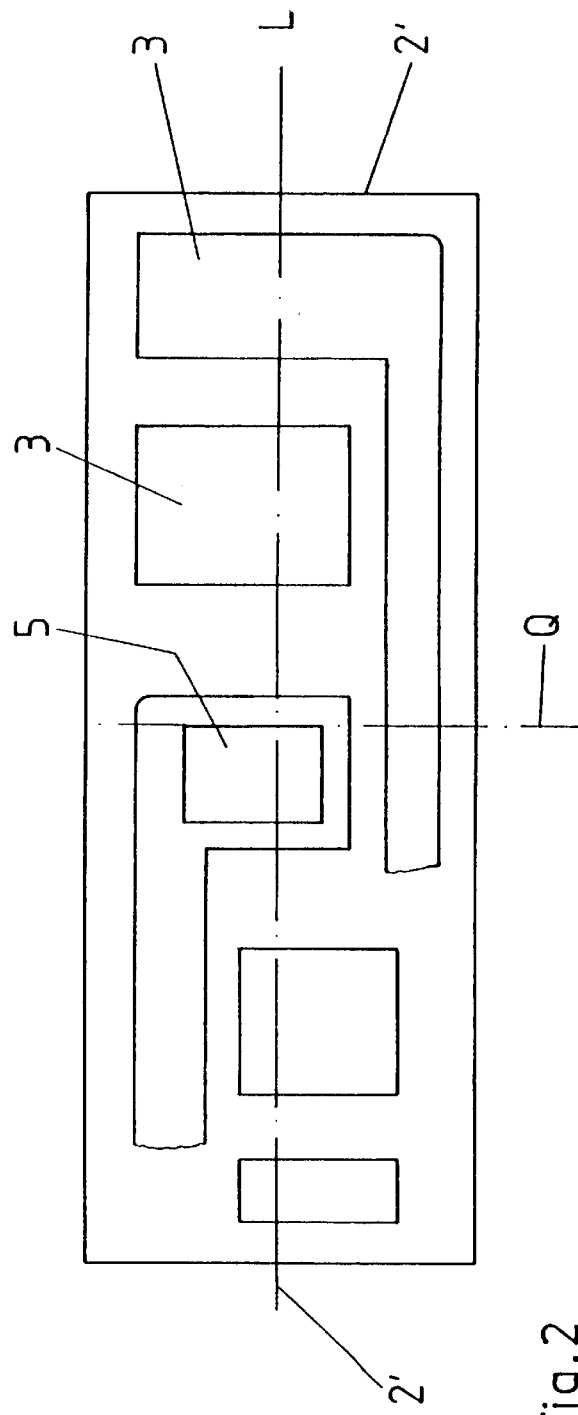

16

15

14

METAL CERAMIC SUBSTRATE

BACKGROUND OF THE INVENTION

The invention relates to an arched metal-ceramic substrate having one curred ceramic layer with a metal coating provided on both sides of the curved layer. The curved substrate having a convex shape in relation to a parallel planar axis.

Production of a metal coating required to produce printed conductors, terminals, etc. on a ceramic, for example an aluminum oxide ceramic using the so-called "DCB process" (direct copper bond technology) using metal or copper foils or metal or copper sheets which form the metal coating, and which have on their surface sides a layer or coating (fused layer) of a chemical compound of the metal and a reactive gas, preferably oxygen, is known. In this process, described for example in U.S. Pat. No. 3,744,120 or in DE-PS 2,319, 854, this layer or this coating (fused layer) forms a eutectic with a melting point below the melting point of the metal (for example, copper) so that by placing the foil on the ceramic and by heating all the layers they can be joined to one another, by fusing the metal or copper essentially only in the area of the fused layer or oxide layer.

This DCB process, for example, has the following process steps:
- oxidation of a copper foil such that a uniform copper oxide layer results;
- application of the copper foil to the ceramic layer;
- heating of the combination to a process temperature between roughly 1070 and 1075° C., for example to roughly 1071° C.;
- cooling to room temperature.

An arched substrate is known (EP 0 279 601) in which the metal layer on the top of the ceramic layer has a much greater thickness than the metal layer on the bottom of this substrate. This formation is also necessary, in the known case, since arching of the completed substrate after cooling is to be achieved using the DCB process, with which the two metal coatings are attached on the ceramic layer. Since the metal coating on the top has a greater thickness, thermally induced stresses on the top are greater than on the bottom, so that the substrate arches concavely on the top and convexly on the bottom during cooling. This "bimetal" effect is reversible, i.e., during heating. A bending back occurs so that when the known substrate is used for power components the contact pressure between the bottom of the substrate and the cooling body is reduced as heating increases, i.e., when a high contact pressure is necessary to achieve especially low heat transfer between the substrate and the cooling body.

The object of the invention is to devise a metal-ceramic substrate which is suitable for electrical or electronic power circuits or modules and which allows improved heat dissipation independent of temperature with simple and problem-free mounting in a housing.

SUMMARY OF THE INVENTION

To achieve this object a metal-ceramic substrate is provided that has a metal coating of equal thickness on its top and bottom.

The curvature of the substrate or ceramic layer makes it possible to bend it elastically flat, such that the substrate, due to the elastic stress of the ceramic layer, tightly and securely abuts one surface of a heat-conducting metal plate and in this way improved heat dissipation results, especially also when using a cooling paste between the substrate and the metal plate. The arching of the substrate is used to ensure optimum contact of the bottom or bottom metal coating of the substrate with for example a metal plate and optimum heat transfer occurs between the substrate and the metal plate, which, for example, forms a cooling body. This improved bond between the substrate and the metal plate achieved by the precurvature of the substrate is to be as constant as possible, regardless of the respective temperature of the substrate or the metal plate. This requirement is not satisfied when one of the two metal layers has a greater thickness, since the metal coating with the greater thickness and thus with the greater volume when the temperature changes, exerts stronger, temperature-induced, changing stresses on the pertinent surface side of the ceramic layer. Different thicknesses of the two metal coatings on the top and bottom would thus lead to temperature-dependent additional arching of the substrate.

BRIEF DESCRIPTION OF THE DRAWINGS

For the degree of curvature for which the invention provides rupture of the ceramic layer is reliably prevented. An embodiment of the invention is detailed below as depicted in the following figures:

FIG. 1 shows in a simplified representation, and in a side view, a substrate according to the invention, together with a metal plate located under the substrate;

FIG. 2 shows an overhead view of the substrate of FIG. 1;

DETAILED DESCRIPTION OF THE INVENTION

Figure 3:
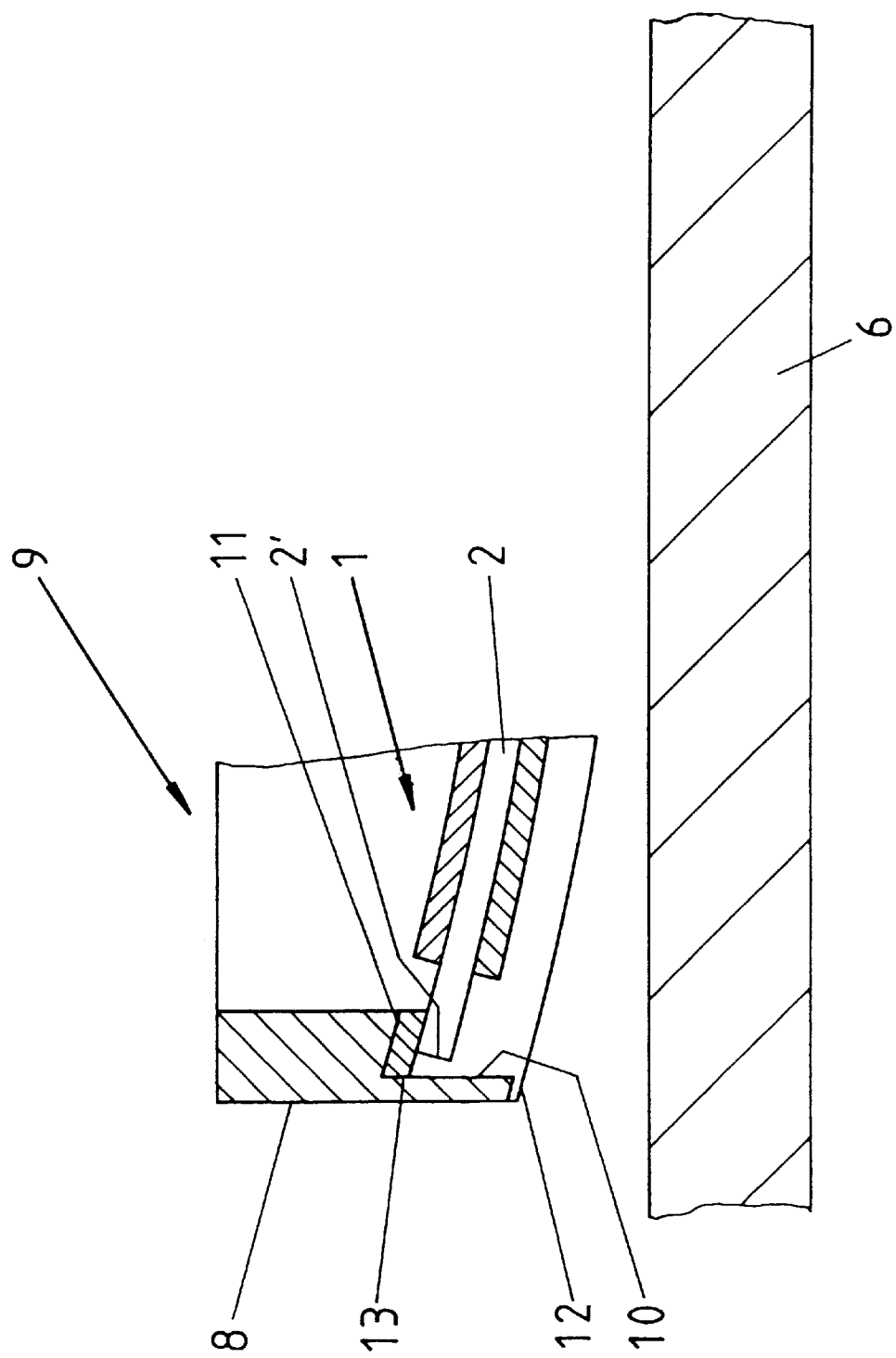
FIG. 3 shows in an enlarged detailed representation a section through the substrate edge clamped in a housing.

Substrate 1 shown in the figures include a ceramic layer or ceramic plate 2 which is for example an aluminum oxide ceramic. The ceramic layer 2 is provided on both surface sides with one metal coating 3 and 4 each. Metal coatings 3 and 4 are each formed by a copper foil which is joined superficially to the ceramic layer 2 using the DCB technique known to one skilled in the art.

In the embodiment shown, ceramic layer 2 in an overhead view has a rectangular pattern with a longer longitudinal axis L and shorter transverse axis Q which runs perpendicular to it. Ceramic layer 2, in the embodiment shown, is arched or curved around an axis parallel to the transverse axis so that the top of ceramic layer 2 is concave and the bottom is convex. In the same way, metal coatings 3 and 4 there are arched. The axis of curvature is labelled Q' in FIG. 1, but in fact has a much greater distance from substrate 1 than is shown in this Figure. Metal coating 3 on the top is textured and forms printed circuits and contact surfaces, and the latter especially for attachment, for example, for surface mounting of electronic components 5. Metal coating 4 is made continuous on the bottom.

The arch of ceramic layer 2 is such that when the substrate with lower metal coating 4 in the center between two transverse sides 2' which are perpendicular to longitudinal axis L and parallel to axis of curvature Q' lies on a flat surface, for example on the top of a flat metal plate 6, the bottom of ceramic layer 2 on each transverse side 2' has distance x from the top of metal plate 6 which is roughly 0.1–0.8% of the length of arched ceramic layer 2 between two sides 2', and plus the thickness of lower metal coating 4. Therefore the following applies $$(0.001 \cdot y + d) \leq x \leq (0.008 \cdot y + d)$$

y being the distance of the two sides 2' and d the thickness of the material of metal coating 4.

It has been found that the thermal conductivity between substrate 1 and metal plate 6, which is for example a component of a heat sink or housing, can be improved. Substrate 1 is placed on plate 6 which is provided on its top with a layer of cooling paste 7 and it is then pressed on the edge and this also on narrow sides 2' onto the plate 6, with which elastic deformation of ceramic layer 2 causes tight contact of lower metal coating 4 on metal plate 6 and uniform distribution of cooling paste 7 over the entire surface of metal plate 6 assumed by lower metal coating 4.

The invention is based on the finding that at a curvature which lies within the aforementioned limits, ceramic layer 2 can be bent back into a flat shape without problems, especially without the danger of fracture, and especially when upper metal coating 3 which is provided on the concave side of the ceramic layer is textured and thus does not form a continuous metal coating at least in a large part of the top of the ceramic layer, but has only short dimensions in the axial direction perpendicular to the axis of curvature. Thus when substrate 1 is bent back into the flat shape excessively high tensile forces cannot occur between ceramic layer 2 and metal coating 3 via upper metal coating 3.

FIG. 3 shows clamping of substrate 1 on the edge, especially also in the area of two narrow sides 2' on part 8 of housing 9, the part forming a rectangular frame, with which substrate 1 can then be attached to plate 6 which forms part of the heat sink using cooling paste 7. To hold the edge of substrate 1 housing part 8 has fold-like recess 10 which among others forms bearing surface 11 for supporting the top of ceramic layer 2 in the edge area. Folded or bearing surface 11, but also bottom 12 of housing part 8, have a curved shape according to the arch of substrate 1 or ceramic layer 2. In addition to the above described advantage of improved heat transfer between substrate 1 and metal plate 6, there is the advantage that stresses between substrate 1 and housing 9 are prevented, especially when substrate 1 is mounted on housing 9. Substrate 1 and housing 9 are elastically deformed only when attached to metal plate 6.

As FIG. 3 shows, between the edge of ceramic layer 2 and folded surface 11 there is an intermediate layer 13 of a permanently elastic mass, preferably of a permanently elastic cement.

In the above described embodiment, it is assumed that substrate 1 is curved only around axis Q'. It is also possible to execute the substrate such that it is curved around two axes which run perpendicularly to one another, specifically around axis Q' parallel to transverse axis Q and at the same time also around the axis parallel to longitudinal axis L, in turn around the two axes concavely on the top so that the substrate for example on the bottom or on metal coating 4 there has a convexly arched surface corresponding to a partial surface of a spherical surface.

Furthermore it is assumed in the described embodiment that metal coatings 3 and 4 each have the same thickness d. Embodiments are also conceivable in which the thickness of the metal coatings is different or in which in the manufacture of substrate 1 for bottom metal coating 4 a foil of greater thickness is used and this metal coating 4 is then ground off on the bottom so that for the substrate an especially smooth bottom results which ensures good heat transfer.

Figure 4C:
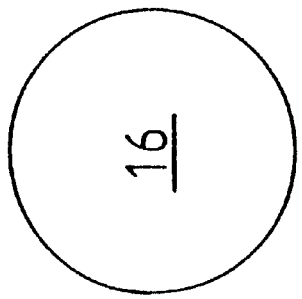
FIG. 4 shows in an overhead view different forms of a substrate of the invention.
Figure 4B:
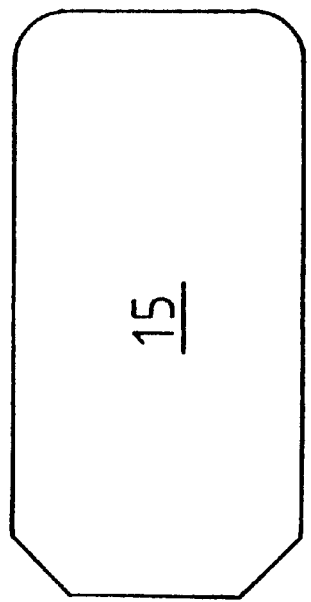
Figure 4A:
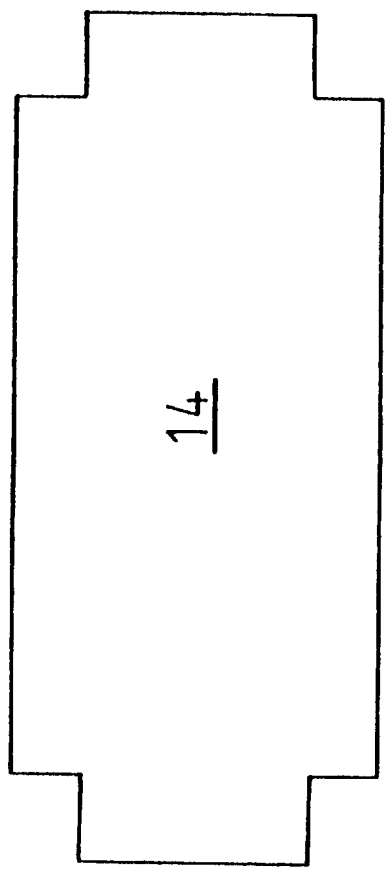

In the above described embodiment it was furthermore assumed that the substrate has a rectangular pattern, i.e., in an overhead view has a rectangular shape. Other forms are also conceivable for the substrate, for example substrate 14 reproduced in FIG. 4, with a shape which is composed of a rectangular or square green form with projection on two opposite sides, or rectangular substrate 15 with rounded and/or bevelled corners and/or round substrate 16.

| REFERENCE NUMBER LIST | |
|---|---|
| 1 | substrate |
| 2 | ceramic layer |
| 2' | transverse side |
| 3, 4 | metal coating |
| 5 | semiconductor component |
| 6 | metal plate |
| 7 | cooling paste |
| 8 | housing part |
| 9 | housing |
| 10 | housing fold |
| 11 | folded surface |
| 12 | bottom |
| 13 | permanently elastic mass |
| 14, 15, 16 | substrate |
| I, Q, Q' | axis |
| x | distance |
| y | length |

We claim:

1. An arched metal-ceramic substrate with one ceramic layer and with a first and second metal coating provided on a top and a bottom, respectively, of said ceramic layer, said substrate being curved around at least one axis parallel to a plane of said substrate such that said substrate forms a convexly curved surface on said bottom, wherein a thickness of metal said first and second coatings on said top and said bottom of said ceramic layer is the same, and wherein a distance (x), which is calculated at an edge of said substrate and is a measure of a distance between said edge of said substrate and a part of said ceramic plate which tangentially touches said center of curvature of said ceramic substrate and is from 0.1–0.8% of a longitudinal dimensional of said substrate, and wherein said first and second metal coatings are applied to a precurved ceramic layer.

2. An arched substrate according to claim 1, wherein said substrate has a rectangular pattern, and wherein said axis of curvature runs parallel to shorter sides of said pattern.

3. An arched substrate according to claim 1, wherein said substrate has a rectangular pattern with rounded or bevelled edges.

4. An arched substrate according to claim 1, wherein said substrate has a round pattern with rounded or bevelled edges.

5. An arched substrate according to claim 1, wherein said metal coating is textured on said substrate surface.

6. An arched substrate according to claim 1, wherein said first and second metal coatings are formed by metal foils, which are attached superficially to said ceramic layer by means of a DCB technique.

7. An arched substrate according to claim 1, wherein said first and second metal coatings are joined superficially to said ceramic layer by active soldering.

8. An arched substrate according to claim 1, wherein at least said ceramic layer is an aluminum oxide, aluminum nitride or silicon nitride ceramic.

9. An arched substrate according to claim 1, wherein said arched ceramic substrate is a component of a module which has a housing and wherein said edge of said substrate lies against a surface of a housing part, said surface of said housing part having a curvature corresponding to a curvature of said edge of said substrate.

10. An arched substrate according to claim 9, wherein said housing part has on its bottom a surface that has a curvature which corresponds to the curvature of said edge of said substrate.

11. An arched substrate according to claim 9, wherein said ceramic layer of said substrate is held or clamped on at least one edge area via a permanently elastic mass, on said housing part.

12. An arched substrate according to claim 1, wherein said substrate is curved around two axes which run perpendicular to one another.

13. An arched substrate according to claim 1, wherein said second metal coating provided on said bottom of ceramic layer is machined.

14. An arched substrate according to claim 1, wherein said ceramic layer has a rectangular pattern, and wherein said axis of curvature runs parallel to shorter sides of said pattern.

15. An arched substrate according to claim 1, wherein said first metal coating has a rectangular pattern, and wherein said axis of curvature runs parallel to shorter sides of said pattern.

16. An arched substrate according to claim 1, wherein said second metal coating has a rectangular pattern, and wherein said axis of curvature runs parallel to shorter sides of said pattern.

17. An arched metal-ceramic substrate with one ceramic layer and with a first and second metal coating provided on a top and a bottom, respectively, of said ceramic layer, said substrate being curved around at least one axis parallel to a plane of said substrate such that said substrate forms a convex curved surface on said bottom, wherein a thickness of metal said first and second coatings on said top and said bottom of said ceramic layer is the same, wherein a distance (x), which is calculated at an edge of said substrate and is a measure of a distance between said edge of said substrate and a part of said ceramic plate which tangentially touches said center of curvature of said ceramic substrate and is from 0.1–0.8% of a longitudinal dimensional of said substrate, and wherein said substrate has a rectangular pattern, and wherein said axis of curvature runs parallel to shorter sides of said pattern.

18. An arched substrate according to claim 17, wherein said substrate has a rectangular pattern with rounded or beveled edges.

19. An arched substrate according to claim 17, wherein said substrate has a round pattern with rounded or beveled edges.

20. An arched substrate according to claim 17, wherein said metal coating is textured on said substrate surface.

21. An arched substrate according to claim 17, wherein said first and second metal coatings are formed by metal foils, which are attached superficially to said ceramic layer by means of a DCB technique.

22. An arched substrate according to claim 17, wherein said first and second metal coatings are joined superficially to said ceramic layer by active soldering.

23. An arched substrate according to claim 17, wherein at said ceramic layer is an aluminum oxide, aluminum nitride or silicon nitride ceramic.

24. An arched substrate according to claim 17, wherein said arched ceramic substrate is a component of a module which has a housing and wherein said edge of said substrate lies against a surface of a housing part, said surface of said housing part having a curvature corresponding to a curvature of said edge of said substrate.

25. An arched substrate according to claim 24, wherein said housing part has on its bottom a surface that has a curvature which corresponds to the curvature of said edge of said substrate.

26. An arched substrate according to claim 24, wherein said ceramic layer of said substrate is held or clamped on at least one edge area via a permanently elastic mass, on said housing part.

27. An arched substrate according to claim 17, wherein said substrate is curved around two axes which run perpendicular to one another.

28. An arched substrate according to claim 17, wherein said second metal coating provided on said bottom of ceramic layer is machined.

29. An arched substrate according to claim 17, wherein said first and second metal coatings are applied to a pre-curved ceramic layer.

30. An arched substrate according to claim 17, wherein said ceramic layer has a rectangular pattern, and wherein said axis of curvature runs parallel to shorter sides of said pattern.

31. An arched substrate according to claim 17, wherein said first metal coating has a rectangular pattern, and wherein said axis of curvature runs parallel to shorter sides of said pattern.

32. An arched substrate according to claim 17, wherein said second metal coating has a rectangular pattern, and wherein said axis of curvature runs parallel to shorter sides of said pattern.

* * * * *